United States Patent [19]

Makimoto et al.

[11] 4,423,396
[45] Dec. 27, 1983

[54] BANDPASS FILTER FOR UHF BAND

[75] Inventors: Mitsuo Makimoto, Yokohama; Sadahiko Yamashita, Sagamihara, both of Japan

[73] Assignee: Matsushita Electric Industrial Company, Limited, Osaka, Japan

[21] Appl. No.: 306,855

[22] Filed: Sep. 29, 1981

[30] Foreign Application Priority Data

Sep. 30, 1980 [JP] Japan ................................ 55-137205

[51] Int. Cl.³ .................... H03H 7/01; H01P 1/203; H01P 7/08
[52] U.S. Cl. .................................. 333/204; 333/168; 333/219; 333/246
[58] Field of Search ............... 333/167, 168, 202–208, 333/219–235, 246

[56] References Cited

U.S. PATENT DOCUMENTS 2,749,523  6/1956  Dishal ............................. 333/207
4,167,713  9/1979  Pfitzenmaier ................... 333/212
4,180,787  12/1979  Pfitzenmaier ................. 333/212

Primary Examiner—Marvin L. Nussbaum
Attorney, Agent, or Firm—Lowe, King, Price & Becker

[57] ABSTRACT

In a bandpass filter having five or more resonator stages, a sub transmission line is coupled to the main transmission line at the first and fourth resonators. The first to fourth resonators provide peak attenuation points at both sides of the center frequency in the attenuation curve, while the remaining resonators following the fourth resonator further sharpen the attenuation characteristics of the bandpass filter. The main and sub transmission lines may be formed by striplines on a printed circuit board, while the sub transmission line can be capacity coupled to the main transmission line. Coupling capacitances are freely set by setting the length of each gap between adjacent striplines to a desired value. Thus, the peak attenuation points can be accurately controlled to provide a bandpass filter having superior characteristics.

9 Claims, 10 Drawing Figures

BANDPASS FILTER FOR UHF BAND

BACKGROUND OF THE INVENTION

This invention generally relates to a bandpass filter for ultrahigh frequency (UHF) band, and more particularly, the present invention relates to such a bandpass filter having a sub transmission line.

The attenuation characteristics of a bandpass filter, referred to as BPF hereafter, for UHF band is basically determined by the number of stages, namely the number of resonators, included therein. In order to make the attenuation characteristic sharp, the number of stages may be increased. However, increasing in the stage number necessarily increases the loss at the transmission range. Therefore, it is necessary to make the unloaded Q of the resonators large. Since the unloaded Q of a resonator usually increases in proportion to the volume of the resonator, it can be said from the above that it is necessary to increase the number and the size of the resonators to provide a sharp attenuation characteristic when it is desired to maintain a low loss in the transmission range. This means that it is inevitable that a superior BPF tends to be bulky. As a method for resolving this problem, a technique of providing peak attenuation points in the rejection range is known. According to this technique, a sub transmission line is additionally provided as is described later. However, this conventional technique could only be applied to a filter having an even number of stages. Furthermore, the coupling degree of the conventional sub transmission line or branching circuit is difficult to adjust, while the peak attenuation points cannot be satisfactorily controlled with high repeatability.

SUMMARY OF THE INVENTION

The present invention has been developed in order to remove the above-described disadvantages and drawbacks inherent to the conventional bandpass filters having a sub transmission line.

It is, therefore, an object of the present invention to provide a five or more stage bandpass filter having a sub transmission line.

Another object of the present invention is to provide a bandpass filter of simple structure and of low cost.

A further object of the present invention is to provide a bandpass filter with peak attenuation points that can be readily set to desired frequencies without troublesome adjustment.

According to the present invention there is provided a UHF bandpass filter, comprising: (a) a main transmission line having an input port and an output port; (b) five or more resonator stages respectively coupled to said main transmission line; and (c) a sub transmission line interposed between the first and fourth resonators. According to one aspect of the invention the main transmission line is of the capacity coupling type and each of the capacitors of the main transmission line is formed on a dielectric substrate. According to another aspect of the invention, the sub transmission line is capacity coupled to the main transmission line and each of the capacitor for coupling the sub transmission line is formed on a dielectric substrate.

BRIEF DESCRIPTION OF THE DRAWINGS

These and other objects and features of the present invention will become more readily apparent from the following detailed description of the preferred embodiment taken in conjunction with the accompanying drawings in which.

DETAILED DESCRIPTION OF THE INVENTION

Prior to describing the preferred embodiment of the present invetion, the aforementioned conventional BPF is discussed for a better understanding of the objects and features of the present invention.

Figure 1:
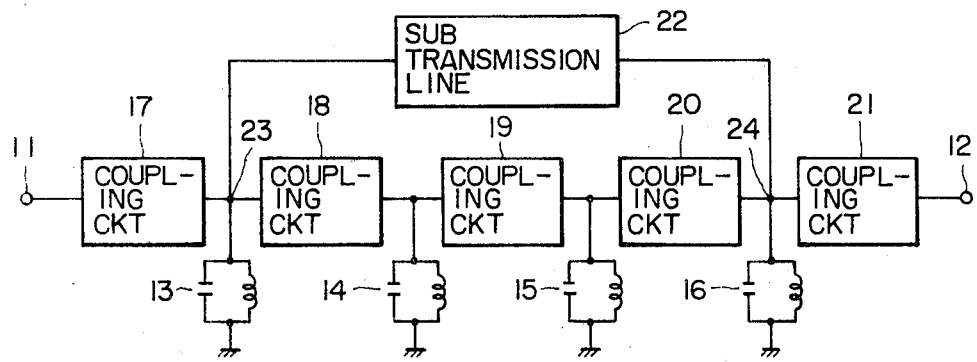
FIG. 1 is a circuit diagram of a conventional bandpass filter having peak attenuation points in the rejection range.

FIG. 1 is a circuit diagram of the conventional BPF having peak attenuation points in the rejection range. The BPF OF FIG. 1 comprises a main transmission line having four or more evenly numbered stages and a sub transmission line interposed between an input resonator and an output resonator. The example of FIG. 1 comprises four stages, and includes shunt resonators 13 to 16 and series coupling circuits 17 to 21 reconnected between input and output terminals 11 and 12. The main transmission line is construted of the resonators 13 to 16 and the coupling circuits 17 to 21. Sub transmission line 22 which is connected to the input resonator 13 at a connecting point 23, and to the output resonator 16 at a connecting point 24. The sub transmission line 22 is arranged such that the degree of coupling between it and the main transmission line is low (below −20 dB) so that the main transmission line is hardly influenced in the transmission range. Furthermore, the difference between the phase of waves propagating from the connecting point 23 to 24 through the main transmission line and the phase of waves propagating through the sub transmission line is arranged to be 360°×n±180 (wherein n=0, 1, 2, ...). At the connecting point 24 of the two transmission lines, the waves transmitted through the sub transmission 22 have an opposite phase to that of the waves transmitted through the main transmission line. Therefore, when the amplitudes of the wave propagating through the main and sub transmission lines are equal to each other, no waves propagate to the output terminal 12 because of total cancellation.

Figure 2:
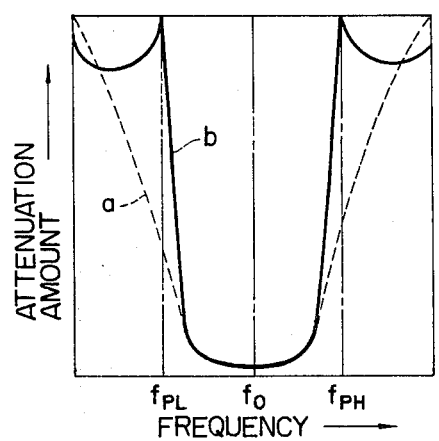
FIG. 2 is a graphical representation of the attenuation characteristics of the conventional bandpass filter of FIG. 1.

FIG. 2 is a graphical representation of the characteristics of the circuit of FIG. 1. A dotted line "a" indicates the characteristics of the FIG. 1 BPF in the absence of the sub transmission line 22, while a solid line "b" is the characteristics in the presence of the sub transmission line 22. The references fPL and fPH are frequencies of peak attenuation points. As is apparent from FIG. 2, with the provision of the sub transmission line 22, peak attenuation points occur at fPL and fPH, and therefore, the attenuation characteristics can be improved without deteriorating the transmission range characteristics.

Figure 3:
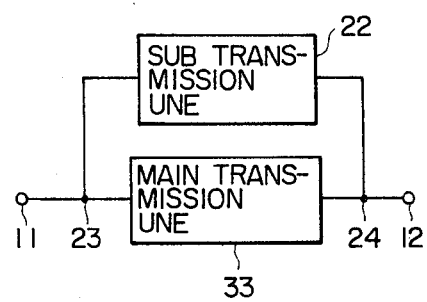
FIG. 3 is a schematic block diagram of the basic structure of the conventional bandpass filter.
Figure 4:
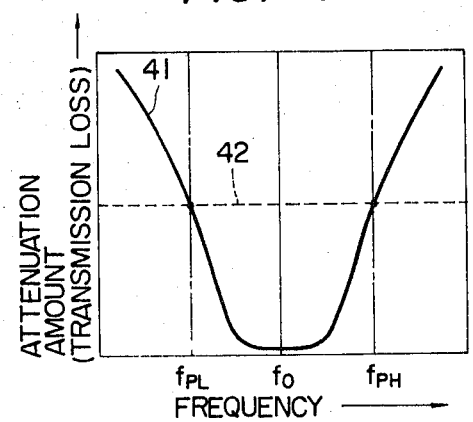
FIGS. 4 and 5 are graphical representations of the characteristics of the conventional bandpass filter of FIG. 3.
Figure 5:
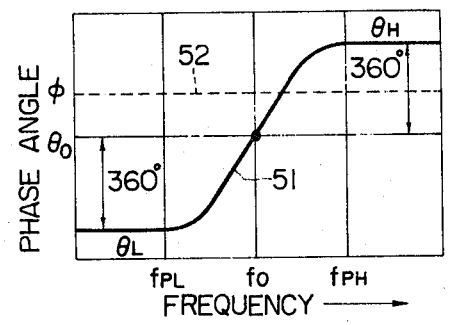

This point is further described with reference to FIG. 3 to FIG. 5. FIG. 3 is a schematic block diagram of the conventional BPF of FIG. 1 including the main transmission line 33 that comprises resonators 13-16 and circuits 17-21; the same elements as those in FIG. 1 are designated at like numerals. FIG. 4 is a graph of the transmission or attenuation characteristics of the two transmission lines 22 and 33 of the conventional BPF of FIG. 3. The solid line indicates the characteristics of the main transmission line 33, while the dotted line indicates the characteristics of the sub transmission line 22. The attenuation levels in the two transmission lines 22 and 33 are equal to each other at the frequencies fPL and fPH. FIG. 5 is a graph of the phase characteristics of the two transmission lines 22 and 33, wherein the solid line indicates the phase characteristics of the main transmission line 33 while the dotted line indicates the phase characteristics of the sub transmission line 22. Assume that the phase of the main transmission line 33 at the center frequency fO is expressed in terms of its C components are dominant due to the frequency lower than fO. Namely, when a four-stage filter is used, the waves through the main transmission line are retarded by $90° \times 4 = 360°$ from $\theta_O$. On the contrary, in a rejecting frequency range considerably higher than fO, the LC resonator can be regarded as an inductance, and therefore, the waves through the main transmission line 33 are advanced by $90° \times 4 = 360°$ from $\theta_O$. Let us assume that $\theta_L = \theta_O - 360°$, $\theta_H = \theta_O + 360°$, and the phase of the sub transmission line 22 is expressed in terms of $\phi$. By setting $\phi = \theta_O + 180°$, yields $\theta_H - \phi = 180°$ and $\phi - \theta_L = 180° + 360°$. Accordingly, the waves respectively transmitted through the two transmission lines are opposite to each other in a frequency range sufficiently spaced from the center frequency fO. Since the amplitudes of the waves are equal to each other at fPH and fPL as shown in FIG. 4, the characteristics of the circuit of FIG. 3 are capable of having peak attenuation points, as shown in FIG. 2. Although the circuit of FIG. 1 has been described taking an example of a four-stage filter, the same results are obtained with a filter having more evenly numbered stages.

Namely, considering a BPF of m even stages, the above-mentioned $\theta_L$ and $\theta_H$ are respectively given by $\theta_L = \theta_O - 90° \times m$, and $\theta_H = \theta_O + 90° \times m$. By setting $\phi$ as $\phi = \theta_O + \phi_O$, and as $\theta_H - \phi = 90° \times m - \phi_O = 180°$, the following relationship of $\phi_O = 180° - 90° \times m$ is obtained. Accordingly, $\phi - \theta_L = 180° (m-1)$. In order that $\phi - \theta_L$ is an integral multiple of 180°, the value of m should be even. Although a case of m=2 is possible to theoretically, such an arrangement provides fewer improvements, while the attenuaton characteristics below fPH and above fPL of FIG. 2 deteriorate. For this reason, in usual practice, four or more stages of even number (namely, m=4, 6, 8 . . . ) are used.

As described in the above, by providing a sub transmission line (or a branching circuit), the attenuation characteristics of a BPF can be improved. However, the above-described technique could only be applied to a filter having four or more stages of even number, while it is difficult to adjust the coupling degree of the sub transmission line and therefore the repeatability of the peak attenuation points is poor.

The present invention provides a new BPF which may comprise five or more stages of even or odd number so that the attenuation characteristics can be further improved, while the structure of the BPF is simple and the repeatability of peak attenuation points is ensured. The feature of the present invention resides in an arrangement that a sub transmission line is connected between first and fourth resonators of a row of more than four resonators, such as 5, 6, 7 . . . in contrast with the conventional arrangement in which the sub transmission line is interposed between the input and output resonators which are respectively connected to the input and output of a BPF of four or more stages of even number (namely, 4, 6, 8, 10 . . . ). With this arrangement, although the symmetry of the circuit arrangement is lost, to cause the peak attenuation point frequencies fPH and fPL to be asymmetrical with respect to the center frequency fO, this does not raise a serious problem in practical use by setting the degree of coupling of the sub transmission line at a value less than −40 dB. According to the present invetion, since at least one filter is connected in series after the connecting point of the sub transmission line, the attenuation characteristics in the frequency ranges above fPH and below fPL are superior to the conventional arrangement.

Figure 7:
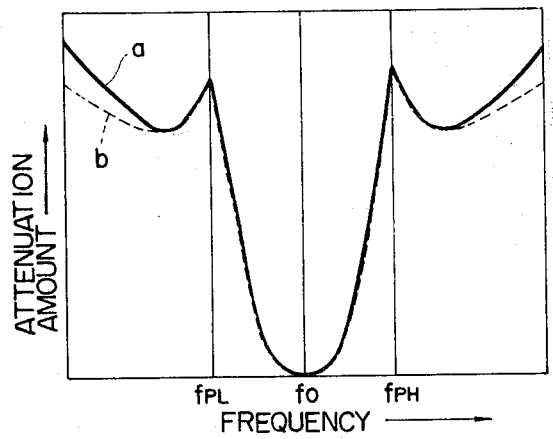
FIG. 7 is a graphical representation of the filtering characteristic of the bandpass filter according to the present invention in comparison with the conventional BPF.
Figure 6:
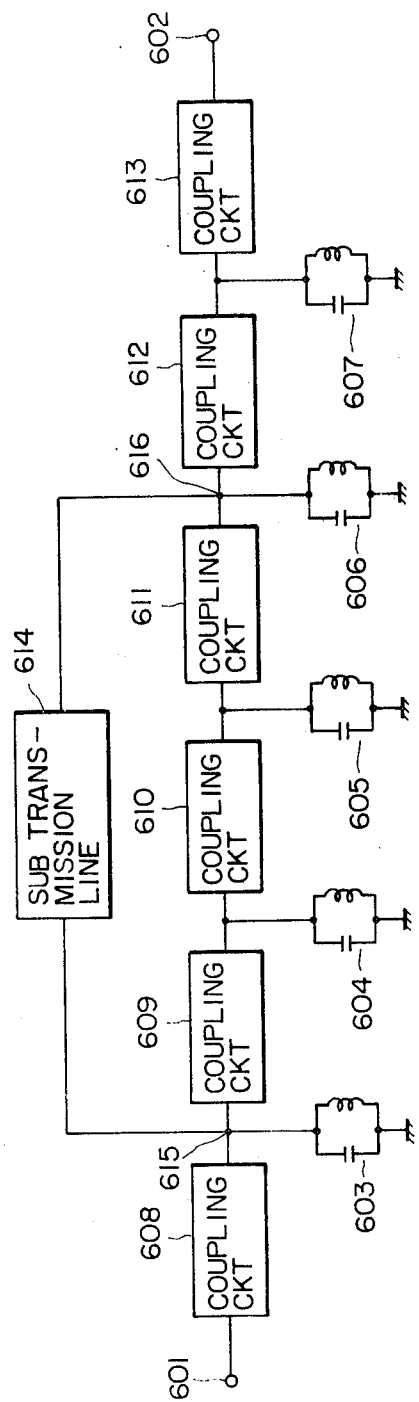
FIG. 6 is a circuit diagram of a basic circuit arrangement of the bandpass filter according to the present invention.

Hence, reference is now made to FIG. 6 a circuit diagram of basic structure of the BPF according to the present invetion. The BPF in FIG. 6 includes input and output terminals 601 and 602, shunt resonators 603 to 607, series coupling circuits 608 to 613 of the BPF a sub transmission line or a branching circuit 614. One terminal of line 614 is connected to branching point 615 between circuits 608 and 609 while a second terminal of the line is connected to joining point 616 between circuit 611 and 612. Although the example of FIG. 6 is shown to be of five stages, the number of resonators following the joining point 616 is not limited. Namely, there is no limit in the number of stages as in the conventional arrangements, while the attenuation characteristics can be improved as shown in FIG. 7.

To improve the characteristics of a 6-stage BPF by providing peak attenuation points, the sub transmission line 614 has been interposed between the first stage, which is the input stage, and the sixth stage, which is the output stage, in the prior art. The dotted curve "b" of FIG. 7 shows the characteristics of such a conventional 6-stage BPF having a sub transmission line. On the contrary, according to the present invention, the sub transmission line is interposed between the first and fourth stages of the 6-stage BPF. The solid curve "a" of FIG. 7 shows the attenuation characteristics of such a BPF according to the present invention. As shown in the graph of FIG. 7, the attenuation characteristics of both curves "a" and "b" are substantially equal to each other in the vicinity of the center frequency fO. However, in the upper and lower rejection ranges, which are spaced from fO, the attenuation characteristic of the BPF according to the present invention is superior to that of the conventional one. The reason for this difference resides in the fact that the first to fourth stages of the BPF according to the present invention are related to producing the peak attenuation points, and the following two stages have attenuation characteristics independently of the operation of the former four stages. As a result of such operation, the attenuation characteristics can be improved throughout a wide range according to the present invention.

Figure 8:
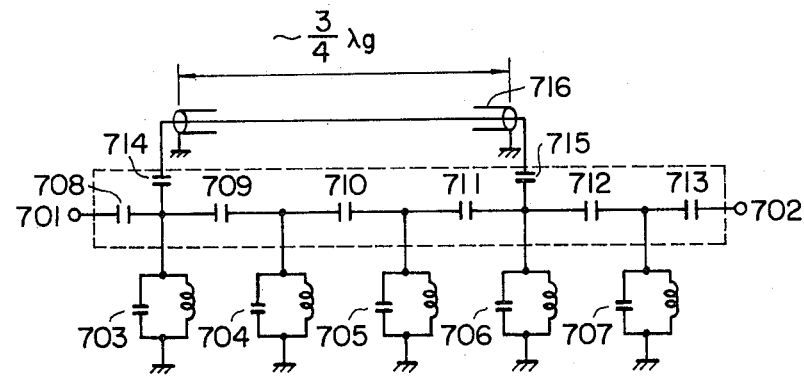
FIG. 8 is a circuit diagram of an embodiment of the present invention.
Figure 9:
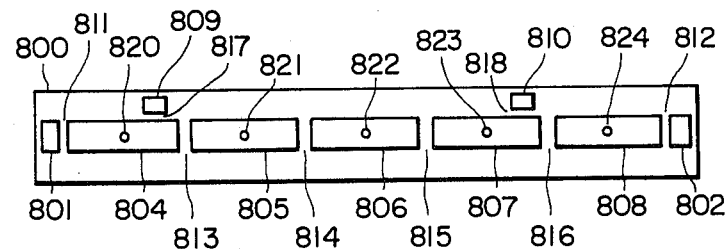
FIG. 9 is a top plan view of a print circuit on which coupling capacitances of the bandpass filter of FIG. 8 are formed.

FIG. 8 is a circuit diagram of an embodiment of the BPF according to the present invention, and FIG. 9 is a top plan view of a printed circuit having capacitors included in the BPF circuit of FIG. 8. Although the embodiment of FIGS. 8 and 9 is shown by way of an example of 5-stage BPF connected between input terminals 701 or 801 and output terminals 702 or 802, the number of stages may be more than five, and there is no limit in the number of stages. In FIG. 8, the shunt resonators 703 to 707 are of a lump constant or distributed constant type. The coupling circuits of the BPF are capacitively coupled, by interstage series coupling capacitances 708 to 713. The sub transmission is constructed of coupling capacitances 714 and 715 and a phase adjusting coaxial cable 716. In the case that the sub transmission line is coupled via capacitances to the main transmission line, the length of the cable 716 is selected at approximately $3\lambda g/4$ at the center frequency where $\lambda g$ is the wavelength.

The reason for this is described. In the example of FIG. 8, the value of $\theta_O$ of FIG. 5 is 270°. Therefore, $\theta_L = -270° - 360° = -630°$ Assuming that the phase delay due to the transmission line length is expressed in terms of $\phi_L$, and considering the phase delay of the coupling circuits, $\phi$ of the sub transmission line is given by $\phi = \phi_L - 180°$. From the above, in order that $\theta_L$ has an opposite phase with respect to $\phi$, $\phi_L = -270°$ has to be fulfilled. Namely, the transmission line length is selected at $3\lambda g/4$.

The frequencies fPH and fPL defining the peak attenuation points are determined by the values of the capacitances 714 and 715, and therefore, it is possible to change the fPH and fPL by varying the values of the capacitances 714 and 715.

All of capacitances 708 to 713, 714 and 715 enclosed by dotted lines of FIG. 8 may be formed on a printed circuit board, so that adjustment of the coupling circuits is not required. As a result, repeatability of the peak attenuation points is ensured. FIG. 9 is a top plan view of a printed circuit on which the coupling capacitances 708 to 713, 714 and 715 are formed by stripline patterns formed on a dielectric substrate 800 on which are located input and output electrodes 801 and 802, electrodes 809 and 810 for the connection of resonators; 809 and 810, electrodes for forming the sub transmission line. Each of the capacitances is formed by utilizing the gaps 811 to 818 between adjacent electrodes. Since each of the capacitances is defined by the size of the gap, the frequencies fPH and fPL can be accurately controlled. When it is intended to make the capacitance larger, a capacitor having an interdigital grating pattern may be used. Electrodes 804 to 808 respectively include through holes 820 to 824 for the connection of corresponding resonators (not shown in FIG. 9). The stripline pattern of FIG. 9 is readily formed by the photo-etching method, so that the value of each capacitance can be controlled with high accuracy.

Figure 10:
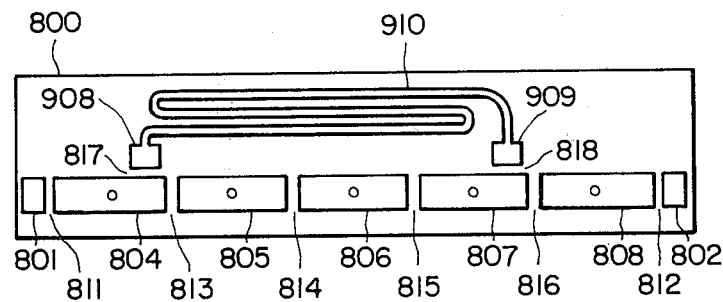
FIG. 10 is a top plan view of a print circuit on which all the coupling capacitances and sub transmission line are formed.

FIG. 10 is a top plan view of a modification of the printed circuit of FIG. 9. The arrangement of FIG. 10 differs from that of FIG. 9 in that the coaxial cable 716 of FIG. 8, which is for adjusting the phase, is formed of a microstrip formed on the dielectris substrate 800. Namely, the electrode 809 of FIG. 9 is connected by a stripline 910 to the electrode 809. The length of the stripline 910 is $3\lambda g/4$.

From the foregoing, it will be understood that the coupling capacitances as well as the sub transmission line of the BPF according to the present invention can be formed on a single printed circuit, and therefore, the BPF is easy to manufacture, while the invention has another advantage that bandpass filters having superior attenuation characteristics can be mass produced at a low cost. Since the technique according to the present invention can be adapted to bandpass filters having more than four stages of odd or even number, freedom in designing a bandpass filter can be greatly improved.

The above-described embodiment is just an example of the present invention, and therefore, it will be apparent for those skilled in the art that many modifications and variations may be made without departing from the spirit of the present invention.

What is claimed is:
1. A bandpass filter for UHF band, comprising:
   (a) a dielectric substrate;
   (b) a main transmission line having input and output electrodes, said main transmission line being formed of a plurality of striplines formed in line on said dielectric substrate;
   (c) five or more resonators respectively coupled to said striplines between said input and output electrodes;
   (d) first and second coupling striplines formed on said dielectric substrate, said first coupling stripline being located adjacent to the first stripline which is immdediately next to said input electrode, said second coupling stripline being located adjacent to the fourth stripline; and
   (e) a sub transmission line stripline formed on said dielectric substrate and interposed between said first and second coupling striplines.
2. A UHF bandpass filter comprising:
   (a) a main transmission line formed on a dielectric substrate and having input and output ports and capacitive coupling circuits connected between said ports, each of said circuits including a capacitor formed on the dielectric substrate;
   (b) five or more stages of resonators respectively coupled to said main transmission line; and
   (c) a sub transmission line interposed between the first and fourth resonators.
3. A bandpass filter for UHF band as claimed in claim 2, wherein said sub transmission line comprises a stripline formed on a dielectric substrate, the length of said stripline being equal to three fourth of the wavelength.
4. A UHF bandpass filter comprising:
   a dielectric substrate;
   a main transmission line having an input port and an output port;
   five or more stages of resonators respectively coupled to said main transmission line; and
   a sub transmission line interposed between the first and fourth resonators;
   means for capacitively coupling said sub transmission line to said main transmission line, said capacitive coupling means including at least one coupling capacitor, each of the coupling capacitors being formed on the dielectric substrate.
5. A bandpass filter for UHF band as claimed in claim 4 wherein said sub transmission line comprises a stripline formed on the dielectric substrate, the length of said stripline being equal to three fourths of a wavelength of a signal passed by the bandpass filter.

6. The filter of claim 5 wherein the main transmission line comprises a strip line formed on the dielectric substrate.

7. The filter of claim 6 wherein the main transmisson line includes capacitive coupling circuits connected between said ports, each of said circuits including a capacitor formed on the dielectric substrate.

8. The filter of claim 4 wherein the main transmission line comprises a strip line formed on the dielectric substrate.

9. The filter of claim 8 wherein the main transmission line includes capacitive coupling circuits connected between said ports, each of said circuits including a capacitor formed on the dielectric substrate.

* * * * *